(12) United States Patent
Herrmann et al.

(10) Patent No.: US 10,054,857 B2
(45) Date of Patent: Aug. 21, 2018

(54) SWITCHABLE MIRROR LENS SYSTEM FOR REDIRECTING LASER ENERGY DURING PERIODS OF NON-PRINTING

(71) Applicant: Xerox Corporation, Norwalk, CT (US)

(72) Inventors: Douglas K. Herrmann, Webster, NY (US); Jason M. Lefevre, Penfield, NY (US); Paul J. McConville, Webster, NY (US); Steven R. Moore, Pittsford, NY (US)

(73) Assignee: XEROX CORPORATION, Norwalk, CT (US)

( * ) Notice: Subject to any disclaimer, the term of this patent is extended or adjusted under 35 U.S.C. 154(b) by 117 days.

(21) Appl. No.: 15/354,267

(22) Filed: Nov. 17, 2016

(65) Prior Publication Data

US 2018/0136564 A1    May 17, 2018

(51) Int. Cl.

| B41J 2/447 | (2006.01) |
|---|---|
| B41J 2/455 | (2006.01) |
| G02B 26/08 | (2006.01) |
| G03F 7/20 | (2006.01) |

(52) U.S. Cl.
CPC .............. *G03F 7/702* (2013.01); *B41J 2/447* (2013.01); *G02B 26/0833* (2013.01); *B41J 2/455* (2013.01)

(58) Field of Classification Search
CPC .. G03F 7/702; G03F 7/70275; G03F 7/70291; G03F 7/2051; G03F 7/70208; G03F 7/70458; G03F 9/70; G02B 26/0833; B41J 2/45; B41J 2/465; B41J 2/4753; A61J 1/18; A61J 2200/44; B41F 7/02; B41F 7/26

See application file for complete search history.

(56) References Cited

U.S. PATENT DOCUMENTS

| 5,061,049 | A | 10/1991 | Hornbeck |
|---|---|---|---|
| 6,028,692 | A | 2/2000 | Rhoads et al. |
| 6,057,816 | A | 5/2000 | Eckersley |
| 6,647,166 | B2 | 11/2003 | Richardson |
| 6,762,871 | B2 | 7/2004 | Yoshimura |
| 7,184,201 | B2 | 2/2007 | Duncan |
| 7,542,199 | B1 | 6/2009 | Mayer et al. |
| 7,679,808 | B2 | 3/2010 | Kim |
| 7,795,564 | B2 | 9/2010 | Lindgren |
| 7,864,825 | B2 | 1/2011 | Thiagarajan et al. |

(Continued)

OTHER PUBLICATIONS

Nayar, S. K., Programmable Imaging Using a Digital Micromirror Array, Proceedings (2004) 1:1-436-443.

(Continued)

*Primary Examiner* — Huan Tran
(74) *Attorney, Agent, or Firm* — Kermit D. Lopez; Luis M. Ortiz; Ortiz & Lopez, PLLC

(57) ABSTRACT

A laser imaging system and method for printing includes a digital micromirror device and a switchable mirror element that acts as a clear lens element during the printing by the laser imaging system. A laser diode array provides a laser to the switchable mirror element in a laser path, wherein the switchable mirror element is located in the laser path between the laser diode array and the digital micromirror device to divert energy out of the system and away from the digital micromirror device during periods of non-laser imaging without reducing or powering down the laser system.

20 Claims, 4 Drawing Sheets

(56) References Cited

U.S. PATENT DOCUMENTS

| | | |
|---|---|---|
| 8,179,588 B2 | 5/2012 | Yamada et al. |
| 8,280,131 B2 | 10/2012 | Kempe et al. |
| 8,432,597 B2 | 4/2013 | Knipe |
| 8,896,752 B2 | 11/2014 | De Haan |
| 8,960,917 B2 | 2/2015 | Tseng |
| 9,093,812 B2 | 7/2015 | Ryudo et al. |
| 9,310,610 B2 | 4/2016 | Border |
| 9,310,697 B2 | 4/2016 | Yun et al. |
| 9,366,867 B2 | 6/2016 | Border et al. |
| 2006/0227514 A1 | 10/2006 | Kang et al. |
| 2006/0268387 A1 | 11/2006 | Lianza |
| 2007/0126997 A1 | 6/2007 | Kang |
| 2008/0049446 A1 | 2/2008 | Harbers et al. |
| 2008/0285120 A1 | 11/2008 | Lo et al. |
| 2010/0039692 A1 | 2/2010 | Yamada et al. |
| 2010/0110024 A1 | 5/2010 | Kim et al. |
| 2013/0107222 A1 | 5/2013 | Hsu et al. |
| 2013/0314671 A1 | 11/2013 | Tseng |
| 2014/0300881 A1 | 10/2014 | Kim et al. |
| 2015/0070746 A1 | 3/2015 | Powers et al. |
| 2015/0160454 A1 | 6/2015 | Bhakta |
| 2015/0202892 A1* | 7/2015 | Jessen .................. B41J 11/002 34/245 |
| 2015/0377446 A1 | 12/2015 | Bhakta |
| 2016/0093081 A1 | 3/2016 | Kim et al. |
| 2018/0067300 A1* | 3/2018 | LeFevre ................ G02B 26/02 |

OTHER PUBLICATIONS

DeBoer, C., Digital Light Processing (DLP) Television & Projection, Audioholics, LLC, Aug. 30, 2004, 5 pages.

Lee, B., DMD 101: Introduction to Digital Micromirror Device (DMD) Technology, Application Report, DLPA008A—Jul. 2008—Revised Oct. 2013, Texas Instruments, 11 pages.

Horsley, S. D., Digital Micromirror Device (DMD) From R&D to a Profitable Business, DLP, A Texas Instruments Technology, 24 pages.

Thermochromism—Wikipedia, the free encyclopedia, printed Aug. 11, 2016, 5 pages.

Low Cost, Stable Switchable Mirrors: Lithium Ion Mirrors with Improved Stability, Lawrence Berkeley National Laboratory, printed Sep. 28, 2016, 2 pages.

Transition-Metal Switchable Mirrors, From the Lab to the Marketplace 10 years later, Energy Efficient Technologies from Research at the Lawrence Berkeley National Laboratory, printed Sep. 28, 2016, 2 pages.

Yoshimura, K. et al., Development of switchable mirror glass, Synthesiology (2012) 5(4):253-260, translation.

* cited by examiner

SWITCHABLE MIRROR LENS SYSTEM FOR REDIRECTING LASER ENERGY DURING PERIODS OF NON-PRINTING

TECHNICAL FIELD

Embodiments are generally related to DMD (Digital Micromirror Device) systems and applications. Embodiments are also related to marking and printing methods and systems such as, for example, applications involving offset lithography. Embodiments also relate to systems, devices, and methods that utilize switchable mirror elements to redirect laser energy during periods of non-printing.

BACKGROUND

Offset lithography is a common method utilizing in modern printing operations. (Note that for the purpose hereof, the terms "printing" and "marking" are interchangeable.) In a typical lithographic process, a printing plate (i.e., which may be a flat plate, the surface of a cylinder, belt, etc.) can be configured with "image regions" formed of, for example, hydrophobic and oleophilic material, and "non-image regions" formed of a hydrophilic material. Such image regions correspond to the areas on the final print (i.e., the target substrate) that are occupied by a printing or a marking material such as ink, whereas the non-image regions correspond to the areas on the final print that are not occupied by the marking material.

The Variable Data Lithography (also referred to as Digital Lithography or Digital Offset) printing process begins with a fountain solution used to dampen a silicone imaging plate on an imaging drum. The fountain solution forms a film on the silicone plate that is on the order of about one (1) micron thick. The drum rotates to an "exposure" station where a high power laser imager is used to remove the fountain solution at the locations where the image pixels are to be formed. This forms a fountain solution based "latent image." The drum then further rotates to a "development" station where lithographic-like ink is brought into contact with the fountain solution based "latent image" and ink "develops" onto the places where the laser has removed the fountain solution. The ink is hydrophobic. An ultra violet (UV) light may be applied so that photo-initiators in the ink may partially cure the ink to prepare it for high efficiency transfer to a print media such as paper. The drum then rotates to a transfer station where the ink is transferred to a printing media such as paper. The silicone plate is compliant, so an offset blanket is not used to aid transfer. UV light may be applied to the paper with ink to fully cure the ink on the paper. The ink is on the order of one (1) micron pile height on the paper.

The formation of the image on the printing plate is done with imaging modules each using a linear output high power infrared (IR) laser to illuminate a digital light projector (DLP) multi-mirror array, also referred to as the "DMD" (Digital Micromirror Device). The mirror array is similar to what is commonly used in computer projectors and some televisions. The laser provides constant illumination to the mirror array. The mirror array deflects individual mirrors to form the pixels on the image plane to pixel-wise evaporate the fountain solution on the silicone plate. If a pixel is not to be turned on, the mirrors for that pixel deflect such that the laser illumination for that pixel does not hit the silicone surface, but goes into a chilled light dump heat sink. A single laser and mirror array form an imaging module that provides imaging capability for approximately one (1) inch in the cross-process direction. Thus, a single imaging module simultaneously images a one (1) inch by one (1) pixel line of the image for a given scan line. At the next scan line, the imaging module images the next one (1) inch by one (1) pixel line segment. By using several imaging modules, comprising several lasers and several mirror-arrays, butted together, imaging function for a very wide cross-process width can be achieved.

One non-limiting example of a DMD system utilized in the context of a lithographic application is disclosed in U.S. Pat. No. 8,508,791 entitled "Image feedforward laser power control for a multi-mirror based high power imager" which issued to Peter Paul et al on Aug. 13, 2013, and is assigned to Xerox Corporation of Norwalk, Conn. U.S. Pat. No. 8,508,791 is incorporated herein by reference in its entirety.

Some laser imaging systems utilize high intensity line-source lasers to deliver energy selectively to clear thermo-chromic inks. The thermo-chromic inks change from clear to black at a given energy level. Digitally selective heating of the inks with an LIM (Laser Imaging Module) delivers a digital image on a surface pre-coated with the thermo-chromatic inks. DMD's were originally designed to operate with lower incident energy levels. The current level of incident energy exceeds the device's ability to adequately dissipate heat from the DMD chip. If the DMD chip (and its internal components) exceeds a critical temperature (e.g., 70° C.), the DMD chip can become damaged. Currently the DMD can only run at 80% power for 20 seconds before reaching a temperature maximum. The desire is to have the ability to operate the device at 100% power at 100% duty-cycle.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for improved laser imaging systems and methods.

It is another aspect of the disclosed embodiments to provide for a laser imaging system that utilizes a DMD, one or more switchable mirror elements, and a laser diode array as part of a laser imaging module.

It is still another aspect of the disclosed embodiments to provide for a switchable mirror element that acts as a clear lens element during printing by a laser imaging system.

The aforementioned aspects and other objectives and advantages can now be achieved as described herein. Laser imaging systems and methods for printing are disclosed, which include a digital micromirror device and a switchable mirror element that acts as a clear lens element during the printing by the laser imaging system. A laser diode array provides a laser to the switchable mirror element in a laser path, wherein the switchable mirror element is located in the laser path between the laser diode array and the digital micromirror device to divert energy out of the system and away from the digital micromirror device during periods of non-laser imaging without reducing or powering down the laser system.

In some example embodiments, a laser dump (or trap) can be utilized, such that the system allows for both a transparent mode in which the laser is allowed to pass to the digital micromirror device and onto a thermos-chromatic ink and a reflective mirror mode that redirects a main incident laser to the laser dump (or trap).

In some example embodiments, a laser imaging module can be provided, which includes the aforementioned laser diode array, wherein the switchable mirror element functions as a non-mechanical switchable mirror that allows the laser to remain powered even during short print breaks in laser imaging while redirecting incident energy away from the digital micromirror device thereby reducing an operating temperature of a laser imaging module without inducing any mechanical vibration.

In some example embodiments, the switchable mirror element can be integrated into the print data stream and is actuated based on print data, process speeds, and media/ink presence.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
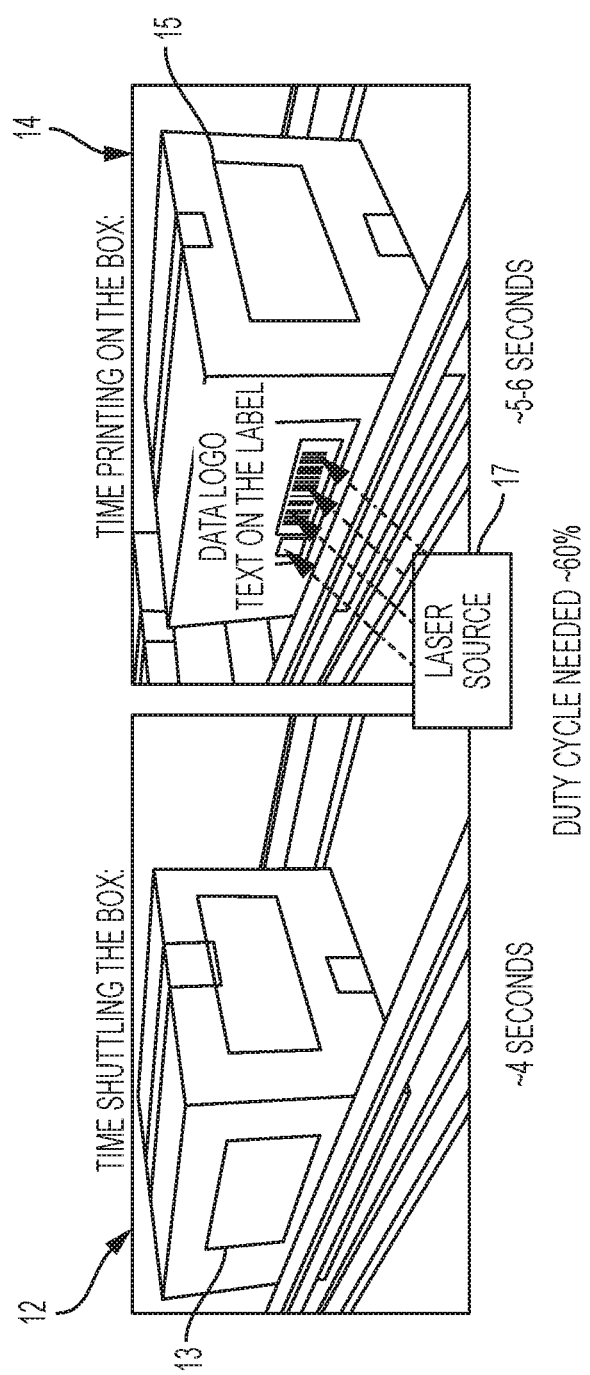
FIG. 1 illustrates an image of a box during time shuttling and an image of another box with time printing thereon, in accordance with an example embodiment.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

High-intensity line-source lasers can be utilized to deliver energy selectively to clear thermochromic inks. Such thermochromic inks can change from clear to black at a given energy level. Digitally selective heating of the inks with an LIM (Laser Imaging Module) delivers a digital image on a surface pre-coated with the thermo-chromatic inks. In the disclosed embodiments, laser energy is incident (input) on a DMD chip for 100% of its operating time even though there may be large periods of time when no energy is required as an output from the LIM.

This scenario is very evident in FIG. 1 demonstrating an example usage of LIM technology with thermochromic inks. FIG. 1 illustrates an image 12 of a box 13 during time shuttling and an image 14 of another box 15 with time printing thereon and with a laser source indicated, in accordance with example embodiments. The example scenario shown in FIG. 1 demonstrates that there is a significant amount of time, when the printed substrate is moving in which no imaging needed. A video demonstration of this scenario can be found at: https://www.youtube.com/watch?v=HwADVZtxFp4.

The scenario shown in FIG. 1 and in the video at the aforementioned link amounts to ~5-6 seconds of Imaging "On-time" (e.g., see image 14) and ~4 seconds of Imaging "Off-time" (e.g., see image 12). Thus, in this case all that is needed is a ~60% duty-cycle from an LDA (Laser Diode Array) as input to the LIM for an adequate amount of time to image the object. Note that in FIG. 1, a laser source 17 is shown on the box 15. The digital image content transmitted from the laser source 17 may be composed of, for example, a barcode, and/or a QR (Quick Response) code, and so on, as shown in FIG. 1. The FIG. 1 scenario thus provides a basis for arriving at a 60% Laser-ON and 40% Laser-OFF duty-cycle as an example of how the disclosed concept is useful in practice.

Figure 2A:
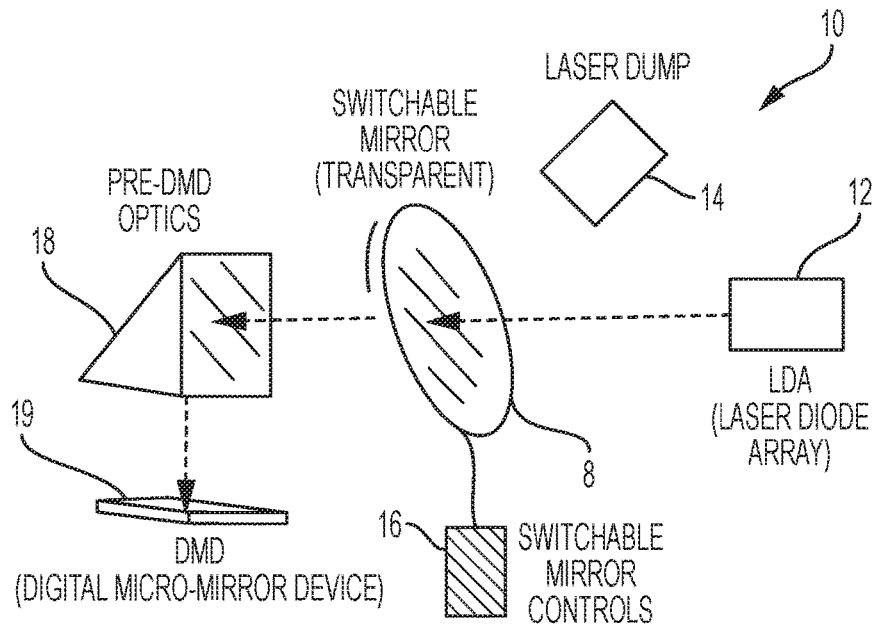
FIG. 2A illustrates a schematic diagram of a system that includes a switchable mirror in the image path between an LDA and DMD Optics (illustrative optics shown) used as a transparent lens during operation and wherein the switchable mirror is set to transparent and not activated, in accordance with an example embodiment.

FIG. 2A illustrates a schematic diagram of a system 10 that includes a switchable mirror 8 in the image path between an LDA (Laser Diode Array) 12 and DMD Optics 18 (illustrative optics shown) used as a transparent lens during operation and wherein the switchable mirror 8 is set to transparent and not activated, in accordance with an example embodiment. A laser dump 14 is shown in FIG. 2A with respect to the switchable mirror 8 (e.g., a switchable mirror element) and the LDA 12. Note that the LDA 12 may form part of an overall LIM (Laser Imaging Module). Switchable mirror controls 16 control the actions of the switchable mirror 8.

Figure 2B:
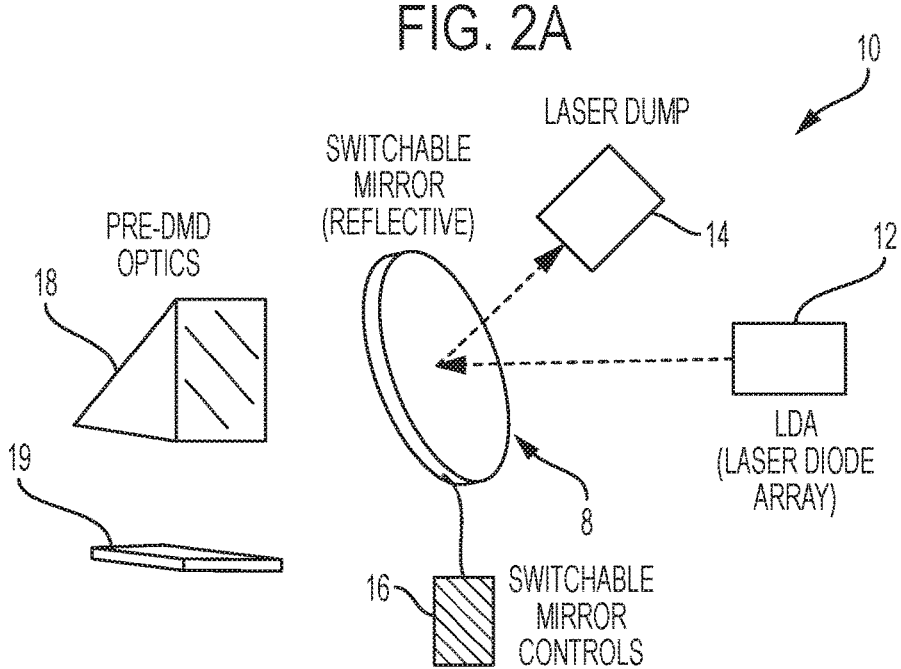
FIG. 2B illustrates a schematic diagram of a system that includes a switchable mirror in the image path between an LDA and DMD Optics (illustrative optics shown) with a switchable mirror set to mirror/reflective to send a laser to trap/dump-activated component, in accordance with an example embodiment.

FIG. 2B illustrates a schematic diagram of the system 10 shown in FIG. 2B including the switchable mirror 8 in the image path between the LDA 12 and DMD Optics 18 (illustrative optics shown) with the switchable mirror 8 set to mirror/reflective to send a laser to a trap/dump-activated component such as laser dump 14, in accordance with an example embodiment. Thus, FIG. 2A illustrates system 10 in a transparent mode and FIG. 2B shows the same system 10 in a reflective mode. Note that in FIGS. 2A-2B, identical or similar parts or elements are generally indicated by identical reference numerals.

In the system 10 depicted in FIGS. 2A-2B, the switchable mirror 8 acts as a clear lens element during printing. This means that the inherent losses or efficiency is dependent on the lens physics not the mirror physics in delivering the laser energy to the DMD. For example, if the transparency of the lens is rated at 99.999% efficient, the DMD will get close to 100% of the incident laser energy needed for printing. This is good. If the mirror on the other hand has less reflective efficiency, say 85%, this would lead to the case where not all of the incident energy will be reflected during the non-printing portion of the duty cycle. In this example, 85% of the energy would be diverted and 15% would continue onto the DMD even though it is not needed. This leads to very efficient printing and lower efficiency during non-printing. The non-printing efficiency may not be as important since the cooling can handle the 15% loss and/or secondary mechanism can be used to attenuate the additional energy.

The configuration shown in FIGS. 2A-2B thus provides for the switchable mirror 8 introduced into the path upstream of the DMD 19 (e.g., a DMD chip) to redirect incident laser energy away from the DMD when there is a pause in the printing operation (e.g., during short (10 ms to 100 ms) pauses in printing). The system 10 allows for both transparent mode in which the laser is allowed to pass to the DMD 19 and onto the thermos-chromatic ink and for a reflective mirror mode that redirects the main incident laser to a laser dump or trap such as the laser dump 14.

The non-mechanical switchable mirror 8 allows the laser to remain powered even during short print breaks in the image while redirecting the incident energy away from the DMD 19, thereby reducing the operating temperature of the LIM without inducing any mechanical vibration. The switchable mirror 8 can be integrated into the print data stream and can be actuated based on that print data, process speeds, and media/ink presence.

Thus, an electronic switchable mirror 8 can be implemented in the laser path between the LDA 12 and the DMD 19. This is done to divert energy out of the system 10 and away from the DMD 19 in periods of non-laser imaging without reducing or powering down the laser system. Large current draw from the LDA's themselves (several hundred Amps) makes them impractical to turn-on/off frequently.

The switchable mirror system 10 described can be implemented as a system or device (i.e., electrochromic type) that switches between the mirror state and the transparent state when a voltage of a few volts is applied to redirect the laser to a laser dump during periods on non-printing. Based on the image imposition loaded to be printed, the switchable mirror system is transparent to the laser for printing of the image and is activated to be mirrored/reflective during the non-print portions of the imposition to reflect the laser to a laser trap or dump 14. This system of lasers, DMD chip, switchable mirror, and trap allows the system to optimize incident energy to the chip by only directing the laser to the chip during the image print operation and not during inter-image or inter media gap. This allows the entire system to operate while compensating for the actual image "duty" cycle. Because the switchable mirror 8 is electronic it is capable of responding to inter-image gaps as well as media gaps with no added mechanical vibration or inertias.

The switchable mirror in some embodiments can be implemented as a Transition-Metal Switchable Mirrors (TMSM) that includes a glass panel with a coating(s) capable of switching back and forth between a transparent state and a reflective one when activated electronically. The disclosed system can be utilized alone or in conjunction with other methods of reducing incident laser.

Figure 3:
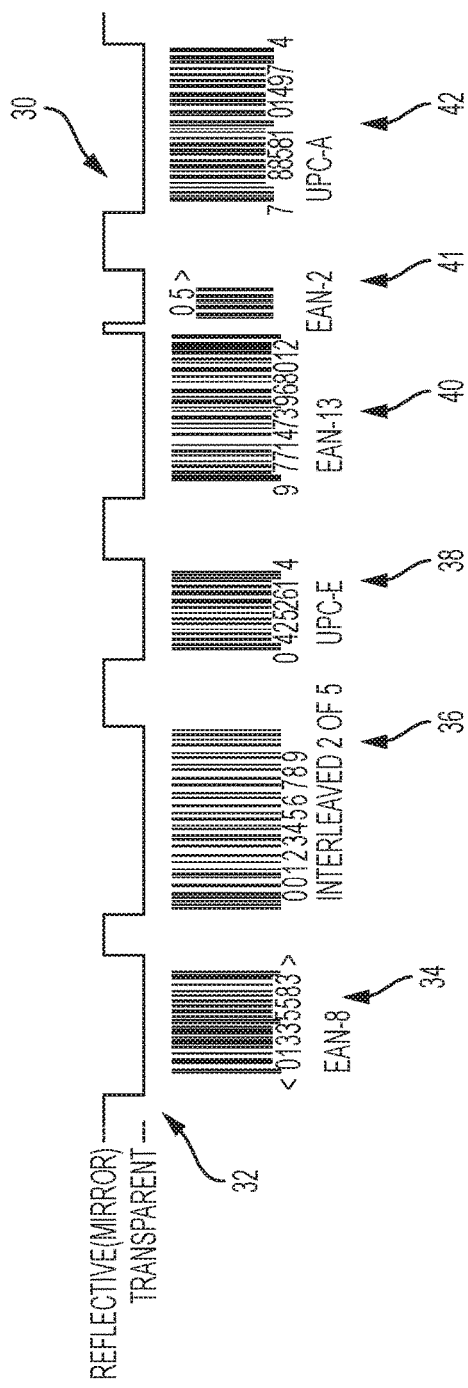
FIG. 3 illustrates a timing diagram with both reflective (mirror) and transparent portions with respect to example bar codes, in accordance with an example embodiment.

FIG. 3 illustrates a timing diagram 30 with both reflective (mirror) and transparent portions with respect to example bar codes 34, 36, 38, 40, 41, and 42, in accordance with an example embodiment. Sequential images (e.g., bar codes 34, 36, 38, 40, 41, 42) with an inter-print gap are shown in FIG. 3 with the associated trigger trace shown (e.g., switchable mirror triggered 14 to reflect laser to DMD 19). A "high" portion of the timing diagram 30 indicates that the mirror 14 is energized during image to reflect the laser to the DMD 19.

Thus, the electronic switchable mirror 14 can be located in the laser path between the LDA 16 and the DMD 19. As indicated previously, this can be implemented to divert energy out of the system 10 and away from the DMD 19 in periods of non-laser imaging without reducing or powering down the laser system. Large current draw from the LDA's themselves (e.g., several hundred amps) makes them impractical to turn-on/off frequently.

The switchable mirror system described herein is thus a device (i.e., electrochromic type) that switches between the mirror state and the transparent state when a voltage of a few volts is applied to redirect the laser to a laser dump during periods on non-printing. Based on the image imposition loaded to be printed, the switchable mirror system is transparent to the laser for printing of the image and is activated to be mirrored/reflective during the non-print portions of the imposition to reflect the laser to a laser trap or dump.

This system 10 of lasers, chip, switchable mirror, and trap allows the system to optimize incident energy to the chip by only directing the laser to the chip during the image print operation and not during inter-image or inter media gap. This allows the entire system to operate while compensating for the actual image "duty" cycle. Because the switchable mirror is electronic, it is capable of responding to inter-image gaps as well as media gaps with no added mechanical vibration or inertias.

Figure 4:
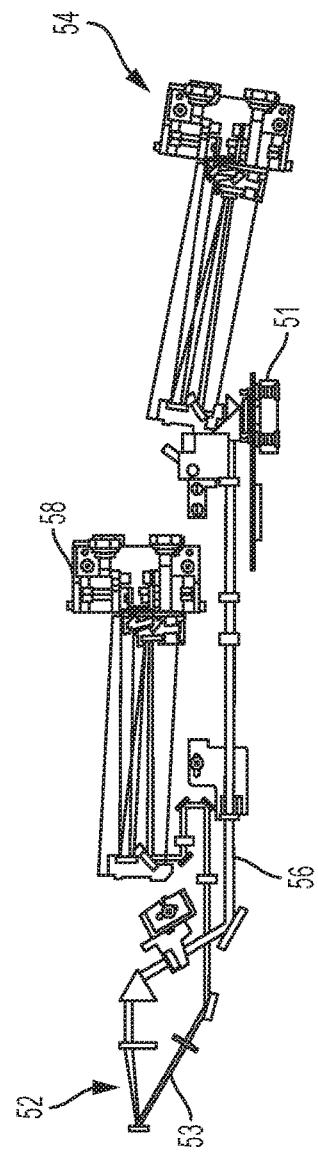
FIG. 4 illustrates a schematic diagram depicting a laser imaging system including imaging LDAs (Laser Diode Arrays) and DMD components, in accordance with an example embodiment.

FIG. 4 illustrates a schematic diagram depicting a laser imaging system including imaging LDAs (Laser Diode Arrays) and DMD components, in accordance with an example embodiment. The system thus includes one or more LDA's such as LDA 54 and one or more DMD's such as, for example, DMD 51. The system may also include one or more preheat LDA's such as a preheat LDA 38. An imaging plane 52 is shown at the left hand side of the configuration shown in FIG. 4. Imaging ray paths 56 and 53 are also shown in FIG. 4. The laser imaging system includes the switchable mirror system 10.

Figure 5:
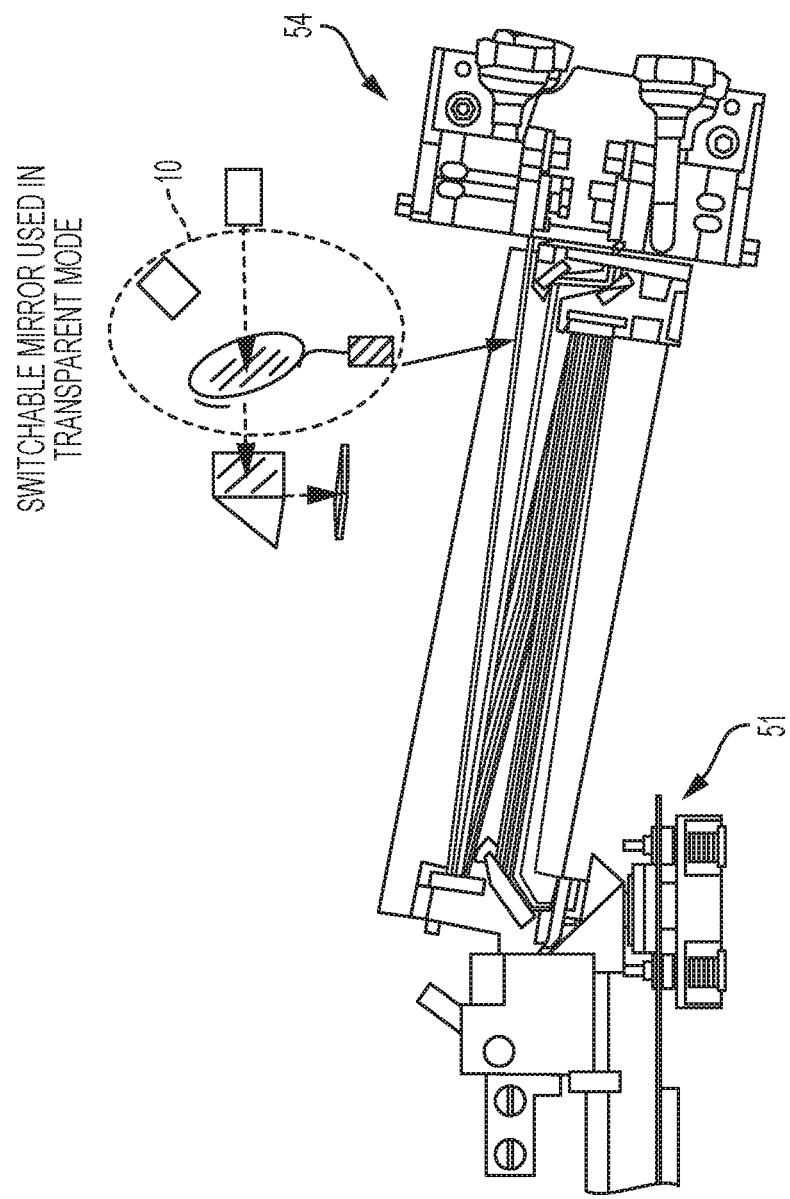
FIG. 5 illustrates a schematic diagram depicting a portion of the laser imaging system shown in FIG. 4 including the LDA 54 and the DMD, in accordance with an example embodiment.

FIG. 5 illustrates a schematic diagram depicting a portion of the laser imaging system shown in FIG. 4 including the LDA 54 and the DMD 51, in accordance with an example embodiment. FIG. 5 specifically depicts a side view of the laser imaging system and the switchable mirror system 10 (i.e., can be implemented as a "subsystem" of the overall laser imaging system). The switchable mirror subsystem 10 acts as an integral mirror in the laser path to the DMD 51. Note that the DMD 51 shown in FIG. 5 is analogous to the DMD 19 shown in FIGS. 2A-2B. That is, the DMD 51 can be implemented in some example embodiments as DMD 19.

The switchable mirror 14 can thus serve as a primary mirror switching the last path located upstream from the thermally sensitive DMD chip to selectively transmit the input laser energy to the DMD or away from the DMD to dissipate incident energy. It can be appreciated, however, that the switchable mirror element 8 acts as a clear lens element during printing.

Based on the image imposition and media spacing, the switchable mirror can be in some example embodiments a primary reflective element of the optics path where it reflects the incident light to the DMD 19 when energized to reflect and when not energized it will allow that laser energy to pass-thru the transparent "mirror" and away from the temperature sensitive components of the LIM to a laser dump. Image content information is available to the switchable mirror 14, so that it can switch as image content changes minimizing amount of laser energy incident on the DMD chip 8 (or DMD 51) and allowing for image dependent activation. The Adjustable mirror opacity can be utilized to limit incident laser to DMD 19 for temporary lower power image requirements or reduced energy to the DMD 19.

Based on the foregoing, it can be appreciated that a number of example embodiments (preferred and alternative) are disclosed herein. For example, in one embodiment a laser imaging system for printing can include: a digital micromirror device and a switchable mirror element; and a laser diode array that provides a laser to the switchable mirror element in a laser path, wherein the switchable mirror element is located in the laser path between the laser diode array and the digital micromirror device to divert energy out of the system and away from the digital micromirror device during periods of non-laser imaging without reducing or powering down the laser system and wherein the switchable mirror element acts as a clear lens element during the printing by the laser imaging system.

In some example embodiments, the aforementioned switchable mirror element can comprise an electronic switchable mirror element. In another example embodiment, the switchable mirror element can be a TMSM (Transition-Metal Switchable Mirror). In still other example embodiments, the switchable mirror element can include glass panels with a coating that switches back and forth between a transparent state and a reflective state when activated electronically.

In another example embodiment, the aforementioned system can include a laser dump wherein the system allows for both a transparent mode in which the laser is allowed to pass to the digital micromirror device and onto a thermos-chromatic ink and a reflective mirror mode that redirects a main incident laser to the laser dump.

In yet another example embodiment, the system can include a laser imaging module comprising the laser diode array, wherein the switchable mirror element comprises a non-mechanical switchable mirror that allows the laser to remain powered even during short print breaks in laser imaging while redirecting incident energy away from the digital micromirror device thereby reducing an operating temperature of a laser imaging module without inducing any mechanical vibration.

In still another example embodiment, the switchable mirror element can be integrated into a print data stream that is actuated based on print data, process speeds, and media/ink presence.

In another example embodiment, a laser imaging system for printing can include: a digital micromirror device and a switchable mirror element; a laser diode array that provides a laser to the switchable mirror element in a laser path, wherein the switchable mirror element is located in the laser path between the laser diode array and the digital micromirror device to divert energy out of the system and away from the digital micromirror device during periods of non-laser imaging without reducing or powering down the laser system and wherein the switchable mirror element acts as a clear lens element during the printing by the laser imaging system; and a laser dump wherein the system allows for both a transparent mode in which the laser is allowed to pass to the digital micromirror device and onto a thermos-chromatic ink and a reflective mirror mode that redirects a main incident laser to the laser dump.

In yet another example embodiment, a laser imaging method for printing can include steps or operations such as providing a laser from a laser diode array to a switchable mirror element in a laser path, wherein the switchable mirror element is located in the laser path between the laser diode array and a digital micromirror device to divert energy out of the system and away from the digital micromirror device during periods of non-laser imaging without reducing or powering down the laser system and wherein the switchable mirror element acts as a clear lens element during the printing by the laser imaging system.

Laser imaging systems and methods for printing are thus disclosed, which include a digital micromirror device and a switchable mirror element that acts as a clear lens element during the printing by the laser imaging system. A laser diode array provides a laser to the switchable mirror element in a laser path, wherein the switchable mirror element is located in the laser path between the laser diode array and the digital micromirror device to divert energy out of the system and away from the digital micromirror device during periods of non-laser imaging without reducing or powering down the laser system.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A laser imaging system for printing, comprising:
a digital micromirror device and a switchable mirror element; and
a laser diode array that provides a laser to said switchable mirror element in a laser path, wherein said switchable mirror element is located in said laser path between said laser diode array and said digital micromirror device to divert energy out of said system and away from said digital micromirror device during periods of non-laser imaging without reducing or powering dawn the laser system and wherein said switchable mirror element acts as a clear lens element during said printing by said laser imaging system.

2. The system of claim 1 wherein said switchable mirror element comprises an electronic switchable mirror element.

3. The system of claim 1 wherein said switchable mirror element comprises a TMSM (Transition-Metal Switchable Mirror).

4. The system of claim 1 wherein said switchable mirror element comprises a glass panel with a coating that switches back and forth between a transparent state and a reflective state when activated electronically.

5. The system of claim 1 further comprising a laser dump wherein said system allows for both a transparent mode in which said laser is allowed to pass to said digital micromirror device and onto a thermos-chromatic ink and a reflective mirror mode that redirects a main incident laser to said laser dump.

6. The system of claim 1 further comprising a laser imaging module comprising said laser diode array, wherein said switchable mirror element comprises a non-mechanical switchable mirror that allows said laser to remain powered even during short print breaks in laser imaging while redirecting incident energy away from said digital micromirror device thereby reducing an operating temperature of a laser imaging module without inducing any mechanical vibration.

7. The system of claim 1 wherein said switchable mirror element is integrated into a print data stream that is actuated based on print data, process speeds, and media/ink presence.

8. A laser imaging system for printing, comprising:
a digital micromirror device and a switchable mirror element;
a laser diode array that provides a laser to said switchable mirror element in a laser path, wherein said switchable mirror element is located in said laser path between said laser diode array and said digital micromirror device to divert energy out of said system and away from said digital micromirror device during periods of non-laser imaging without reducing or powering down the laser system and wherein said switchable mirror element acts as a clear lens element during said printing by said laser imaging system; and
a laser dump wherein said system allows for both a transparent mode in which said laser is allowed to pass to said digital micromirror device and onto a thermos-chromatic ink and a reflective mirror mode that redirects a main incident laser to said laser dump.

9. The system of claim 8 wherein said switchable mirror element comprises an electronic switchable mirror element.

10. The system of claim 8 wherein said switchable mirror element comprises a TMSM (Transition-Metal Switchable Mirror).

11. The system of claim 8 wherein said switchable mirror element comprises a glass panel with a coating that switches back and forth between a transparent state and a reflective state when activated electronically.

12. The system of claim 8 further comprising a laser imaging module comprising said laser diode array, wherein said switchable mirror element comprises a non-mechanical switchable mirror that allows said laser to remain powered even during short print breaks in laser imaging while redirecting incident energy away from said digital micromirror device thereby reducing an operating temperature of a laser imaging module without inducing any mechanical vibration.

13. The system of claim 8 wherein said switchable mirror element is integrated into a print data stream that is actuated based on print data, process speeds, and media/ink presence.

14. A laser imaging method for printing, comprising:
providing a laser from a laser diode array to a switchable mirror element in a laser path, wherein said switchable mirror element is located in said laser path between said laser diode array and a digital micromirror device to divert energy out of said system and away from said digital micromirror device during periods of non-laser imaging without reducing or powering down the laser system and wherein said switchable mirror element acts as a clear lens element during said printing by said laser imaging system.

15. The method of claim 14 wherein said switchable mirror element comprises an electronic switchable mirror element.

16. The method of claim 14 wherein said switchable mirror element comprises a TMSM (Transition-Metal Switchable Mirror).

17. The method of claim 14 wherein said switchable mirror element comprises a glass panel with a coating that switches back and forth between a transparent state and a reflective state when activated electronically.

18. The method of claim 14 further comprising providing a laser dump wherein said system allows for both a transparent mode in which said laser is allowed to pass to said digital micromirror device and onto a thermos-chromatic ink and a reflective mirror mode that redirects a main incident laser to said laser dump.

19. The method of claim 14 further comprising providing a laser imaging module comprising said laser diode array, wherein said switchable mirror element comprises a non-mechanical switchable mirror that allows said laser to remain powered even during short print breaks in laser imaging while redirecting incident energy away from said digital micromirror device thereby reducing an operating temperature of a laser imaging module without inducing any mechanical vibration.

20. The method of claim 14 wherein said switchable mirror element is integrated into a print data stream that is actuated based on print data, process speeds, and media/ink presence.

* * * * *